United States Patent [19]
Osborne

[11] Patent Number: 4,769,714
[45] Date of Patent: Sep. 6, 1988

[54] NOISE AND ARC SUPPRESSION FILTER FOR A DISPLAY DRIVER STAGE

[75] Inventor: Gary T. Osborne, Indianapolis, Ind.

[73] Assignee: RCA Licensing Corporation, Princeton, N.J.

[21] Appl. No.: 922,693

[22] Filed: Oct. 24, 1986

[51] Int. Cl.$^4$ .............................................. H04N 5/63
[52] U.S. Cl. ..................................... 358/243; 358/74; 358/188
[58] Field of Search ............... 358/188, 243, 167, 166, 358/160, 36, 74, 242

[56] References Cited

U.S. PATENT DOCUMENTS

| | | | |
|---|---|---|---|
| 3,757,043 | 9/1973 | Spannhake | 358/188 |
| 4,577,234 | 3/1986 | Harlan | 358/243 |
| 4,591,912 | 5/1986 | Belotserkovsky et al. | 358/166 |
| 4,642,696 | 2/1987 | George | 358/74 |

OTHER PUBLICATIONS

Color Television Service Data for RCA CTC-131 television receiver (file 1984, second edition), pp. 30–31.
Color Television Service Data for RCA CTC-121 television receiver (file 1984), p. 27.

Primary Examiner—Tommy P. Chin
Attorney, Agent, or Firm—Paul J. Rasmussen; Peter M. Emanuel; Ronald H. Kurdyla

[57] ABSTRACT

A low pass filter is placed between an input pre-driver amplifier and an output driver amplifier of a display driver stage, e.g., forming a cascode amplifier. The filter suppresses noise components present in the signal from the pre-driver to prevent the noise components from being amplified and radiated by the output driver amplifier. The filter also suppresses high frequency arc currents before reaching the pre-driver amplifier.

2 Claims, 1 Drawing Sheet

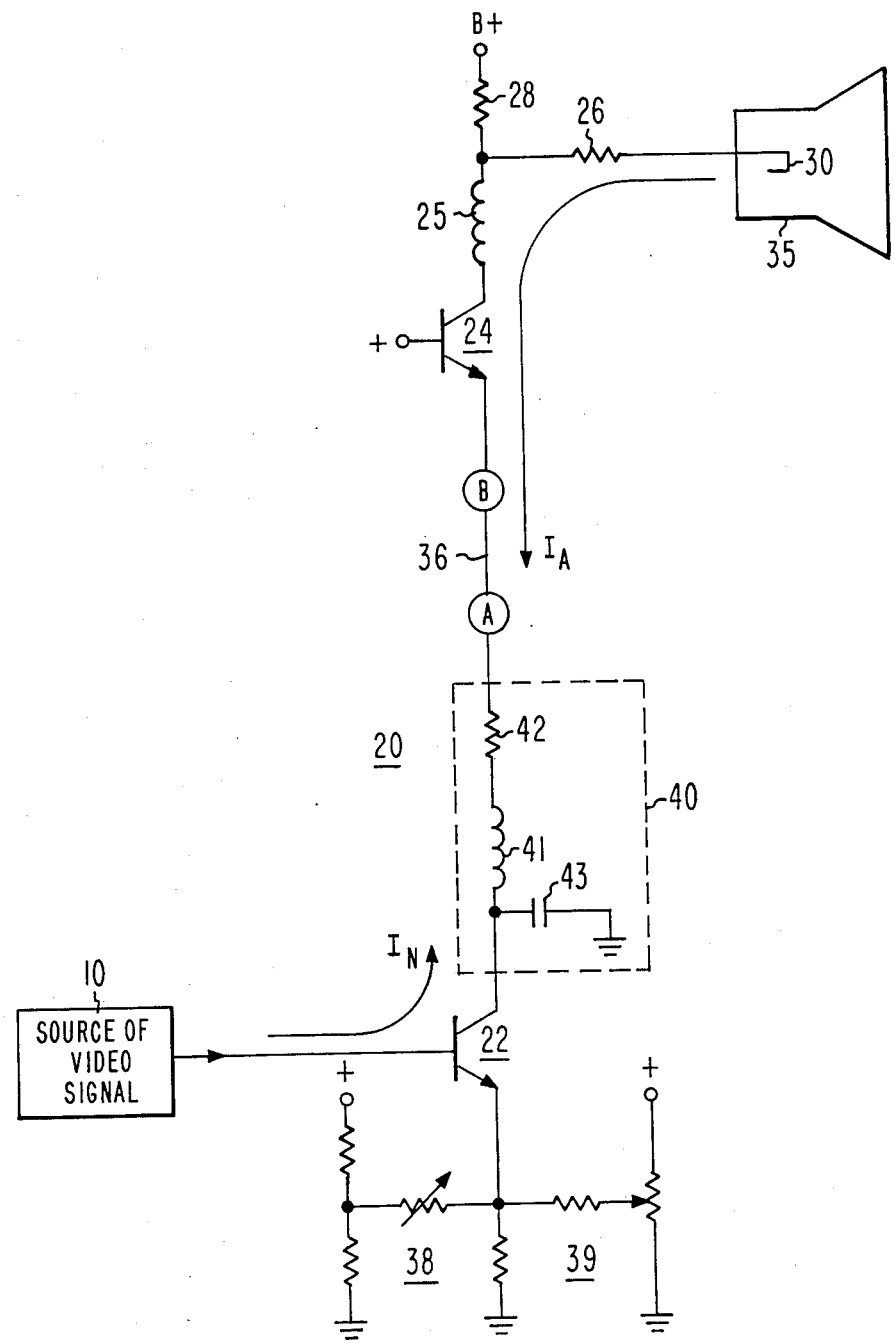

NOISE AND ARC SUPPRESSION FILTER FOR A DISPLAY DRIVER STAGE

This invention concerns a noise and arc suppression filter associated with a display driver stage in a video signal processing and display system such as a television receiver.

In a television receiver, a video signal is processed by various signal processing stages before being applied to an image display device, such as a kinescope, via a display driver stage. High frequency noise is inevitably picked up by the video signal as the video signal is processed. This noise, if amplified to a high level by means of the display driver stage, can radiate with a magnitude sufficient to interfere with the operation of the video signal processing circuits and with nearby electrical equipment. Also, the kinescope in a television receiver is subject to arcing, which is an internal high voltage discharge from the kinescope ultor (anode) electrode to the kinescope cathode electrode or to ground. High voltage kinescope arcs include high frequency components and can undesirably induce large high frequency currents in circuits containing semiconductor devices likely to be damaged by such induced currents, such as pre-driver transistors situated in the vicinity of the kinescope.

In accordance with principles of the present invention, there is disclosed herein a filter, coupled to the display driver stage, for suppressing both high frequency noise components and high frequency currents induced by kinescope arcing. In a disclosed preferred embodiment of the invention, a low pass filter is placed between a low voltage pre-driver amplifier and a high voltage video output driver amplifier. The filter suppresses high frequency noise contained in the video signal output from the pre-driver to prevent such noise from being amplified by the driver. The filter also suppresses high frequency arc currents before such currents can reach and damage the low voltage pre-driver.

In accordance with a feature of the invention, the display driver stage is a cascode amplifier, and the filter is disposed between constituent transistor amplifier devices of the cascode amplifier.

The sole FIGURE of the drawing shows a portion of a television receiver including a kinescope driver stage and a filter in accordance with the principles of the present invention.

A low level video signal from a source 10 is applied to a kinescope driver stage 20 including an input low voltage common emitter amplifier transistor 22 arranged in a cascode video amplifier configuration with an output high voltage common base amplifier transistor 24. A high level amplified video signal with a magnitude suitable for directly driving a cathode intensity control electrode 30 of a kinescope 35 is provided from a collector output circuit of transistor 24. The collector output electrode of transistor 24 is coupled to a high operating potential B+ (e.g., +230 volts) via the series combination of an inductor 25 and a load resistor 28. The amplified video output signal from the collector circuit of transistor 24 is coupled to cathode 30 via an arc current limiting resistor 26, commonly referred to as a "flashover" resistor. The signal gain and the DC bias of driver stage 20 are respectively adjustable by means of a variable resistor 38 and a potentiometer 39 in the emitter circuit of transistor 22.

In accordance with the principles of the present invention, a filter 40 is included in a video signal coupling path between the collector output of transistor 22 and the emitter input of transistor 24. In this example transistor 22 and filter 40 are located on a circuit board containing low level signal processing circuits. Video output transistor 24, load resistor 28, inductor 25 and resistor 26 are located on another circuit board mounted on the neck of the kinescope. The separate circuit boards containing transistors 22 and 24 are connected via a wire 36 and terminals A and B.

Filter 40 is a second order low pass filter including a series inductor 41 and resistor 42, and a shunt capacitor 43, arranged as shown. Filter 40 has similar filtering characteristics in both forward and reverse signal transmission directions, wherein signals conveyed from transistor 22 to transistor 24 are low pass filtered in the same manner as signals conveyed from transistor 24 to transistor 22.

The video signal applied to the base of transistor 22 is likely to include a noise component picked up in the course of prior video signal processing. Thus current conducted by transistor 22 includes a noise current component $I_N$. This noise current component is suppressed by filter 40 to prevent the noise from being amplified by transistor 24 and radiated, with potentially disruptive effects upon other electrical circuits.

Kinescope arcing, a high voltage discharge internal to the kinescope, induces an arc current $I_A$ consisting primarily of high frequency components. Arc currents can be induced in connecting wire 36 and conveyed to transistor 22 with damaging results in the absence of filter 40, which significantly suppresses such arc currents.

Arc current protection for output transistor 24 is provided by means of current limiting resistor 26, and inductor 25 which acts as a choke with respect to high frequency arc currents. Resistor 26 and inductor 25 do not provide sufficient protection of low voltage transistor 22 from arc currents, since these elements do not ensure complete suppression of arc currents, and because arc currents can be induced in connecting wire 36 via a capacitive coupling mechanism. Circuit board layout also influences factors related to arcing and the suppression of voltages and currents generated by arcing.

Filter 40 exhibits a low pass transfer characteristic with a cut-off frequency of between 5 MHz and 6 MHz (at the −3 db point) in this example, which is slightly greater than the bandwidth of the driver stage. Inductor 41 acts as a high frequency choke to suppress high frequency current associated with noise and arc components. Capacitor 43 shunts unwanted high frequency components to ground, and resistor 42 provides a series impedance to arc currents. Resistor 42 also reduces the "Q" of filter 40 to reduce the likelihood of "ringing", and associated image smear, in the presence of signal transients.

Other configurations of filter 40 are possible. For example, inductor 41 can be removed to produce a simpler and less expensive RC low pass filter but with less attenuation of unwanted high frequency components, which may be acceptable in some systems. Also, an additional capacitor can be connected in shunt from the junction of inductor 41 and resistor 42 to ground, to produce a third order filter with a sharper response.

What is claimed is:

1. In a video signal processing and display system, apparatus comprising:
   image display means for producing an image in response to a video signal applied thereto, said image display means being subject to arcing;
   a pre-driver amplifier with a signal input for receiving a video input signal subject to being contaminated with undersirable high frequency components, and a signal output;
   a display driver amplifier with a signal input for receiving a video output signal from said pre-driver amplifier, and a signal output for providing to said image display means said video signal with a magnitude suitable for driving said image display means, said pre-driver amplifier and said display driver amplifier constituting a cascade of two amplifiers; and
   means for coupling said signal output of said pre-driver amplifier to said signal output of said driver amplifier; wherein
   said coupling means includes a filter for suppressing said undesirable high frequency components to prevent said undesirable components from being amplified by said driver amplifier, and for suppressing arc currents associated with said arcing of said image display means to prevent said arc currents from being conducted to said pre-driver amplifier; and wherein said filter is a low pass filter including:
   a resistor coupled in series in a video signal path for conveying said video output signal from said pre-driver amplifier to said driver amplifier; and
   a capacitor coupled to said resistor in shunt with said video signal path.
2. Apparatus according to claim 1, and further comprising:
   an inductor coupled in series with said resistor.

* * * * *